United States Patent [19]
Akram et al.

[11] Patent Number: 6,016,060
[45] Date of Patent: Jan. 18, 2000

[54] METHOD, APPARATUS AND SYSTEM FOR TESTING BUMPED SEMICONDUCTOR COMPONENTS

[75] Inventors: Salman Akram, Boise; Warren M. Farnworth, Nampa; Alan G. Wood; David R. Hembree, both of Boise, all of Id.

[73] Assignee: Micron Technology, Inc., Boise, Id.

[21] Appl. No.: 08/823,490

[22] Filed: Mar. 25, 1997

[51] Int. Cl.$^7$ .......................... G01R 1/067; G01R 31/26
[52] U.S. Cl. ........................... 324/757; 324/754
[58] Field of Search .................. 324/754, 757, 324/158.1

[56] References Cited

U.S. PATENT DOCUMENTS

| | | | |
|---|---|---|---|
| 4,937,653 | 6/1990 | Blonder et al. | 357/68 |
| 4,969,828 | 11/1990 | Bright et al. | 439/68 |
| 5,006,792 | 4/1991 | Malhi et al. | 324/158 F |
| 5,046,239 | 9/1991 | Miller et al. | 29/852 |
| 5,072,289 | 12/1991 | Sugimoto et al. | 357/68 |
| 5,088,190 | 2/1992 | Malhi et al. | 29/843 |
| 5,172,050 | 12/1992 | Swapp | 324/158 P |
| 5,196,726 | 3/1993 | Nishiguchi et al. | 257/737 |
| 5,206,585 | 4/1993 | Chang et al. | 324/158 P |
| 5,249,450 | 10/1993 | Wood et al. | 72/359 |
| 5,289,631 | 3/1994 | Koopman et al. | 29/840 |
| 5,326,428 | 7/1994 | Farnworth et al. . | |
| 5,329,423 | 7/1994 | Scholz | 361/760 |
| 5,341,564 | 8/1994 | Akvavain et al. | 29/832 |
| 5,408,190 | 4/1995 | Wood et al. | 324/765 |
| 5,414,372 | 5/1995 | Levy | 324/765 |
| 5,419,807 | 5/1995 | Akram et al. . | |
| 5,420,520 | 5/1995 | Anschel et al. | 324/754 |
| 5,440,240 | 8/1995 | Wood et al. | 324/765 |
| 5,478,779 | 12/1995 | Akram . | |
| 5,483,741 | 1/1996 | Akram et al. | 29/846 |
| 5,495,179 | 2/1996 | Wood et al. | 324/755 |
| 5,500,605 | 3/1996 | Chang | 324/758 |
| 5,519,332 | 5/1996 | Wood et al. | 324/755 |
| 5,530,375 | 6/1996 | Seidel | 324/761 |
| 5,541,525 | 7/1996 | Wood et al. | 324/755 |
| 5,592,736 | 1/1997 | Akram et al. | 29/842 |
| 5,625,298 | 4/1997 | Hirano et al. | 324/754 |
| 5,686,317 | 11/1997 | Akram et al. . | |

OTHER PUBLICATIONS

Mul, Gary K. et al., "Design Optimization for C4 Bare Die Burn–in and Test Carrier/Socket Assembly (with Statistical Considerations)", *The International Journal of Microcircuits and Electronic Packaging*, vol. 19, No. 2 2nd Qtr 1996, pp. 128–137.

Miyake, K., et al. "Connectivity Analysis of New "Known Good Die" Connection System Using Microbumps", Proceedings if IMC, pp. 156–161, Jan. 1994.

EIAJ/Area Array Subcommittee/Memory CSP WG, JWG#2–8, San Diego, advertising brochure, Jun., 1995.

"Science Over Art. Our New IC Membrane Test Probe", Packard Hughes Interconnect, advertising brochure, 1993 (month unavailable).

"Cobra™ technology, makes Wentworth Labs the world's most advanced probe card manufacturer.", Wentworth Laboratories, 1996 (month unavailable).

*Primary Examiner*—Glenn W. Brown
*Attorney, Agent, or Firm*—Stephen A. Gratton

[57] ABSTRACT

A method, apparatus and system for establishing temporary electrical communication with semiconductor components having contact bumps are provided. The apparatus includes an interconnect having patterns of contact members adapted to electrically contact the contact bumps. Each contact member includes an array of one or more electrically conductive projections in electrical communication with an associated conductor. The projections form contact members for retaining individual contact bumps on the semiconductor components. The projections can be pillars having angled faces covered with a conductive layer. Alternately the projections can be a material deposited on the substrate, or can be microbumps formed on multi layered tape bonded to the substrate. The interconnect can be employed in a wafer level test system for testing dice contained on a wafer, or in a die level test system for testing bare bumped dice or bumped chip scale packages.

25 Claims, 5 Drawing Sheets

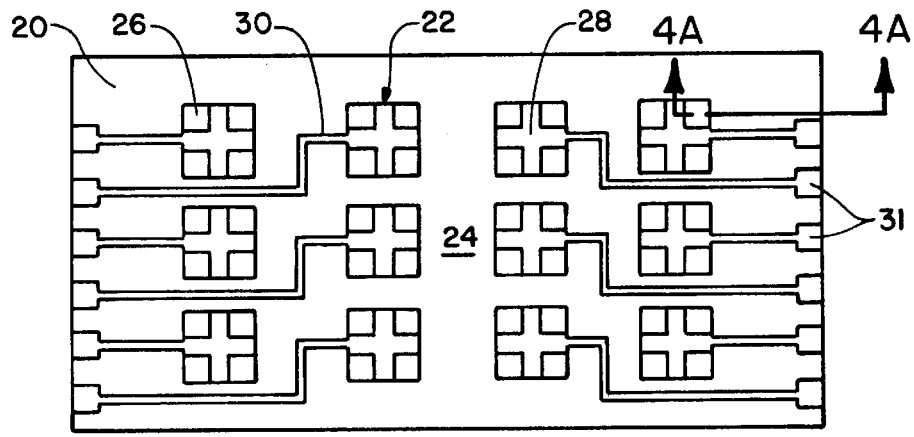
FIGURE 2
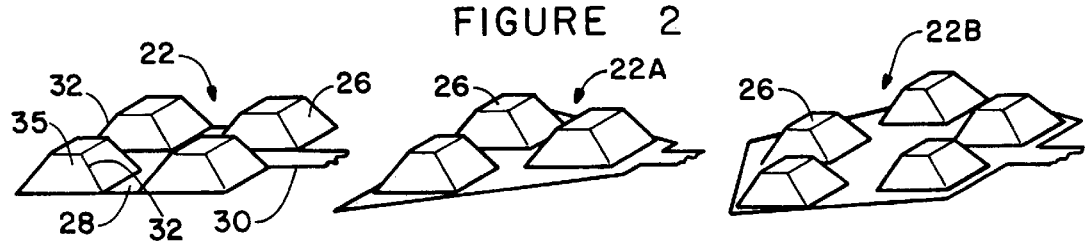
FIGURE 3   FIGURE 3A   FIGURE 3B
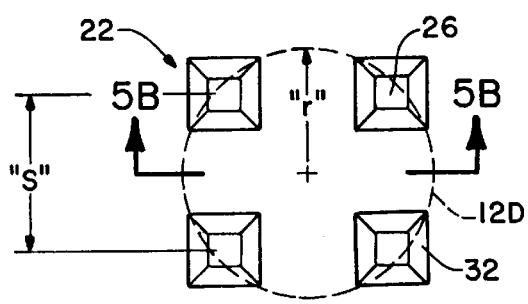
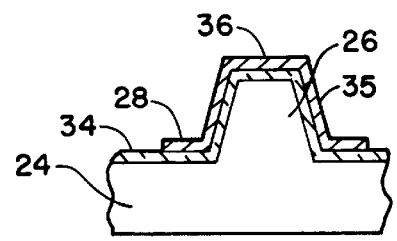
FIGURE 4A
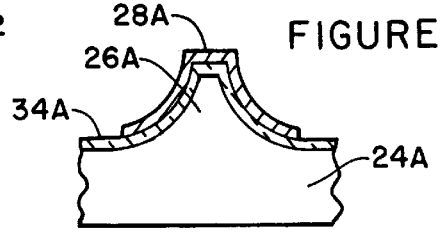
FIGURE 4B
FIGURE 5A
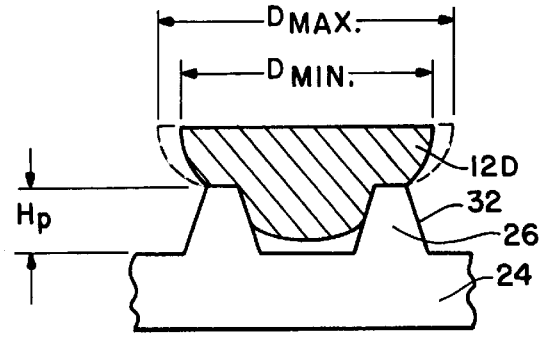
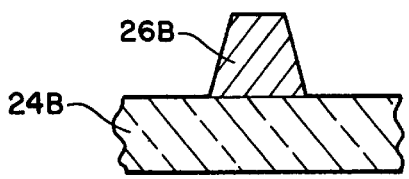
FIGURE 5B   FIGURE 4C

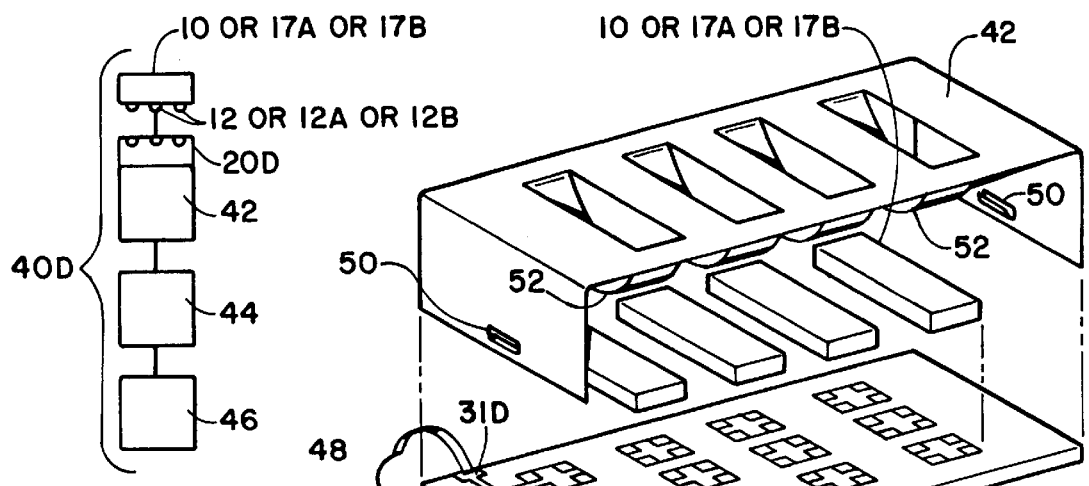
FIGURE 8
FIGURE 8A
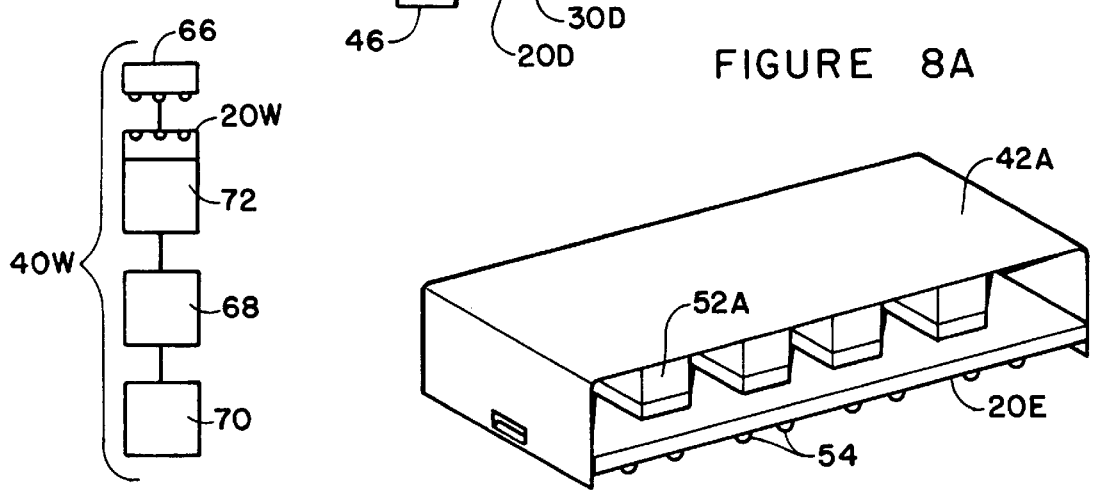
FIGURE 9
FIGURE 8B
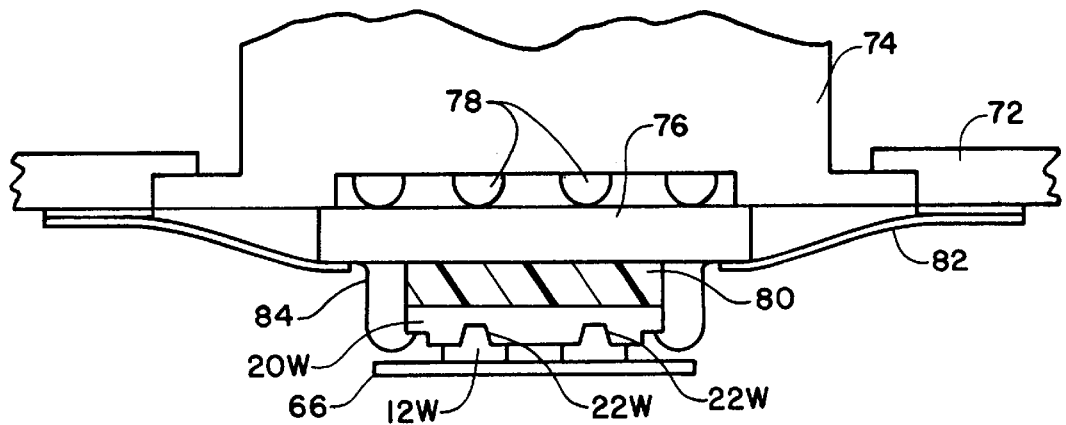
FIGURE 9A

METHOD, APPARATUS AND SYSTEM FOR TESTING BUMPED SEMICONDUCTOR COMPONENTS

FIELD OF THE INVENTION

This invention relates generally to semiconductor manufacture, and more particularly to an improved method, apparatus and system for testing bumped semiconductor components, such as dice and packages having contact bumps.

BACKGROUND OF THE INVENTION

One type of semiconductor die, referred to as a "bumped" die includes patterns of contact bumps formed on a face of the die. The contact bumps can be formed on wettable metal contacts on the die in electrical communication with the integrated circuits contained on the die. The contact bumps allow the die to be "flip chip" mounted to a substrate having corresponding solder wettable contacts. This mounting process was originally developed by IBM and is also known as the C4 joining process (Controlled Collapse Chip Connection).

Lead tin alloys (e.g., 95/5 lead tin alloy) and a ball limiting metallurgy (BLM) process can be used to form the bumps. Typically, the bumps are dome shaped, and have an average diameter of from 5 mils to 30 mils. Micro ball grid arrays (BGA) are formed in the smaller range, while standard ball grid arrays are formed in the larger size range. The sides of the bumps typically bow or curve outwardly from flat top surfaces. The flat top surfaces of the bumps form the actual regions of contact with the mating contacts on the substrate.

Contact bumps are also sometimes included in chip scale packages. In general, a "chip scale package" or "chip size package" refers to a package that includes a bare die along with one or more packaging elements. For example, chip scale packages can include thin protective members attached to the face, sides or backside of the die. In addition, chip scale packages can include contact bumps similar to the bumps on bumped dice. Some persons skilled in the art consider a bumped die the simplest form of a chip scale package.

With bumped dice and chip scale packages, it is sometimes necessary to make non-bonded, or temporary, electrical connections with the contact bumps. For example, in the production of Known Good Die (KGD), semiconductor manufacturers are required to test bumped dice prior to shipment. Temporary packages can be used to house a single bare die, or a chip scale package, for burn-in and other test procedure. These types of temporary packages are disclosed in U.S. Pat. Nos. 5,519,332; 5,541,525; 5,495,179; 5,440,240; and 5,408,190 to Wood et al.

Interconnects associated with the temporary packages can be used to electrically contact the bumps on the dice, or on the chip scale packages. With one type of interconnect, indentations on the interconnect can be sized to retain and electrically contact the bumps. For example, this type of interconnect can include a multi layered tape, similar to TAB tape manufactured by Nitto Denko and others. The tape can include a polyimide layer formed with patterns of indentations, and a metal layer subjacent to the indentations. The bumps fit into the indentations and electrically contact the metal layer.

To assist in making this temporary electrical connection, a temporary package can also include a force applying mechanism, such as a spring, adapted to bias the semiconductor component against the interconnect. A contact force must be generated by the force applying mechanism that is sufficient to break through the native oxide covering the bumps. If a sufficient contact force is not generated, then the resultant electrical connection can be poor. However, it is also advantageous to maintain this contact force as low as possible to avoid excessive deformation of the bumps. In particular, the loaded bumps exhibit creep during the burn-in cycles, which are typically performed at elevated temperatures for several hours or more.

In the past, following testing of dice with contact bumps, it has been necessary to reflow the bumps, which are typically damaged by the test procedure. This is an additional process step which adds to the expense and complexity of the testing process. Furthermore, it requires heating the tested dice which can adversely affect the integrated circuitry formed thereon.

Another consideration in testing bumped dice and chip scale packages is the dimensional variations between the contact bumps. The interconnect must be able to accommodate dimensional variations between bumps on different dice or packages, and dimensional variations between individual bumps on the same die or package. These dimensional variations can include the diameter, height, shape, and location of the bumps. In particular, the diameter and z-dimension location (planarity) of the bumps can make the electrical connections difficult to make without high contact forces.

Trapped gases can also cause problems during a reflow procedure. For example, gases can be trapped between the bumps and indentations and in cavities formed within the bumps. These trapped gas can expand during a reflow connection process causing the solder material to splatter.

In view of the foregoing, improved methods, apparatus and systems for making electrical connections to bumped semiconductor components are needed.

SUMMARY OF THE INVENTION

In accordance with the present invention, an improved method, apparatus and system for testing semiconductor components having contact bumps are provided. The semiconductor components can be singulated bumped dice, bumped dice contained on a semiconductor wafer, or bumped chip scale packages. The method is performed with an interconnect adapted to establish temporary electrical communication with the contact bumps on the semiconductor components.

Several different embodiments of the interconnect are provided. For a die level test system, the interconnect can be configured for use with a burn-in board for testing one or more singulated dice, or one or more chip scale packages. For a wafer level test system, the interconnect can be configured for use with a wafer handler for testing multiple or single dice on a wafer, up to an entire wafer. In each embodiment test signals can be applied through the interconnect to test the semiconductor devices contained on the dice, packages or wafers.

The interconnect comprises a substrate with patterns of contact members and associated conductors. Each contact member comprises one or more projections, configured to retain and electrically contact an individual contact bump. The projections can include an electrically conductive layer, and sharp edges for penetrating native oxide layers covering the contact bumps. The projections can be formed integrally with the substrate using an etching process, or can be added features formed by deposition, lamination or other additive process. In the illustrative embodiments, there are one to five projections per contact member. In addition, the projections can be configured to accommodate dimensional variations in the contact bumps, and variations in the planarity (i.e., z-direction location) of a pattern of bumps. Still further, the projections minimally deform the contact bumps and can be configured to require a minimal amount of contact force.

The die level test system includes an interconnect configured for electrical connection to a testing apparatus, such as a burn-in board, in electrical communication with test circuitry. The interconnect can be used to simultaneously test multiple bare dice, or chip scale packages. In addition, a force applying mechanism can include clips that attach to the interconnect, and a biasing member such as a spring, elastomer, or fluid filled bladder, for biasing the dice or packages, against the interconnect.

In the wafer level test system, an interconnect can be mounted to a probe card fixture of a conventional testing apparatus, such as a wafer handler. During a test procedure, test circuitry associated with the testing apparatus can apply test signals through the interconnect to the integrated circuits on the dice. In addition, the test signals can be electronically switched as required to selected dice on the wafer.

BRIEF DESCRIPTION OF THE DRAWINGS

FIG. 2 is a schematic plan view of an interconnect constructed in accordance with the invention;

FIG. 3 is an enlarged perspective view of a contact member for the interconnect shown in FIG. 2;

FIG. 3A is an enlarged perspective view of an alternate embodiment contact member having three projections;

FIG. 3B is an enlarged perspective view of another alternate embodiment contact member having five projections;

FIG. 4A is an enlarged cross sectional view of a projection for the contact member of FIG. 3A taken along section line 4A—4A of FIG. 2;

FIG. 4B is an enlarged cross sectional view equivalent to FIG. 4A of an alternate embodiment projection formed using an isotropic etch process;

FIG. 4C is an enlarged cross sectional view equivalent to FIG. 4A of an alternate embodiment projection formed using a deposition process;

FIG. 5A is an enlarged plan view of the contact member of FIG. 3;

FIG. 5B is a cross sectional view taken along section line 5B—5B of FIG. 5A;

FIG. 8 is a block diagram of a die level test system constructed in accordance with the invention;

FIG. 8A is a schematic perspective view the die level test system shown during assembly;

FIG. 8B is a schematic perspective of an assembled alternate embodiment die level test system;

FIG. 9 is a block diagram of a wafer level test system constructed in accordance with the invention; and FIG. 9A is a schematic cross sectional view of the wafer level test system.

DETAILED DESCRIPTION OF THE PREFERRED EMBODIMENTS

Figure 1A:
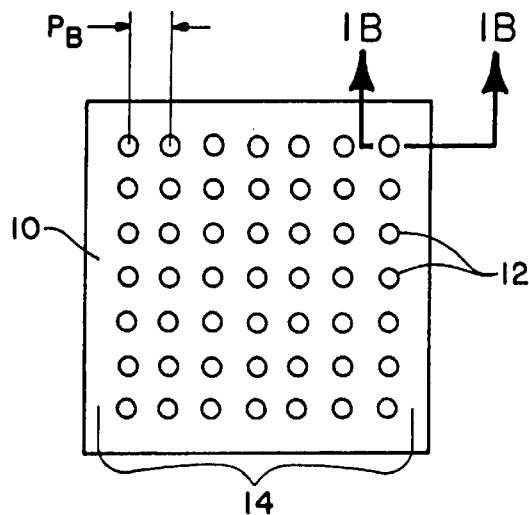
FIG. 1A is a plan view of a prior art bumped semiconductor die including contact bumps arranged in a ball grid array (BGA)
Figure 1B:
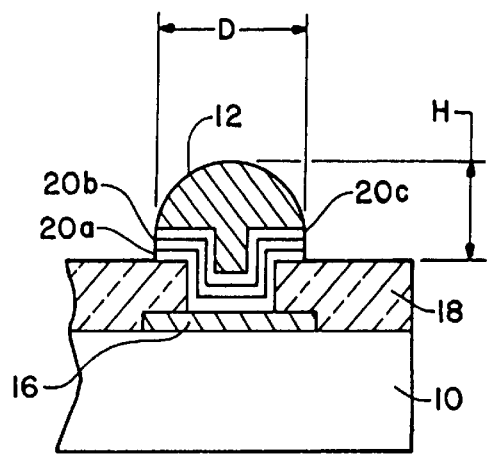
FIG. 1B is a cross sectional view of a prior art contact bump taken along section line 1B—1B of FIG. 1A.

Referring to FIGS. 1A and 1B, a bumped semiconductor die 10 is shown. The die 10 includes a pattern of contact bumps 12 arranged in a ball grid array (BGA) 14. As shown in FIG. 1B, the die 10 also includes a passivation layer 18 and contacts 16 for the bumps 12. The contacts 16 are in electrical communication with the semiconductor devices and integrated circuits formed on the die 10.

Each bump 12 can be formed on a corresponding contact 16. In addition, each bump 12 can include a stack of underlying layers 20a–c. By way of example, layer 20a can be an adherence layer (e.g., Cr), layer 20b can be a solderable layer (e.g., Cu) and layer 20c can be a flash layer (e.g., Au). The bumps 12 can be formed by processes that are known in the art such as ball limiting metallurgy (BLM). Typically, the bumps 12 are formed of a lead/tin solder (e.g., 95 Pb/5 Sn).

As shown in FIG. 1B, each bump 12 can be generally hemispherical, convex, or dome-shaped, with an outside diameter "D" and a height of "H". In general, the diameter "D" of the bumps 12 will be different for different bumps. Also the height "H" will be different causing non-planarity of the ball grid array 14 (FIG. 1A) in the z-direction. Still further, the pitch "$P_B$" (FIG. 1A) and location of the bumps 12 can vary. These dimensional variations will occur between the bumps on the same die and between the bumps on different dice, particularly different types of dice.

Figure 1C:
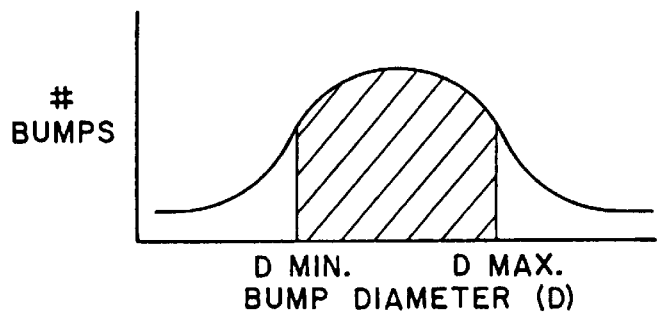
FIG. 1C is a graph illustrating a sampling of a prior art bumped semiconductor dice wherein an average minimum bump diameter ($D_{MIN}$) and an average maximum bump diameter ($D_{MAX}$) are ascertained.

As shown in FIG. 1C, measurement and statistical analysis techniques can be used to ascertain a range of bump diameters "D" for a particular type of die. FIG. 1C shows a simple analysis wherein an average minimum bump diameter ($D_{MIN}$) and an average maximum bump diameter ($D_{MAX}$) are ascertained. A similar analysis can be performed to ascertain an average minimum height ($H_{MIN}$) and an average maximum height ($H_{MAX}$) By determining a statistical average size range for the bumps, an interconnect can be constructed in accordance with the invention to accommodate a range of bumps sizes.

By way of example, a standard micro ball grid array (BGA) can include bumps having an average minimum bump diameter ($D_{MIN}$) of about 4.5 mils and an average maximum bump diameter ($D_{MAX}$) of about 5.5 mils. An average bump diameter (DAVG) can be about 5.0 mils. An average minimum height ($H_{MIN}$) can be about 2.8 mils and an average maximum height ($H_{MAX}$) about 4.2 mils. An average height ($H_{AVG}$) can be about 3.7 mils.

Figure 1D:
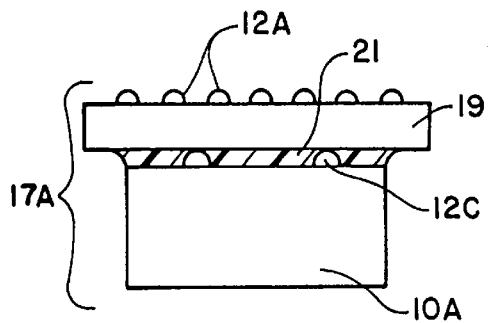
FIG. 1D is a schematic cross sectional view of a prior art chip scale package having contact bumps.
Figure 1E:
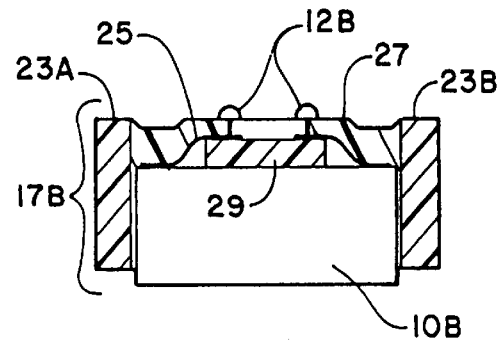
FIG. 1E is a schematic cross sectional view of another prior art chip scale package having contact bumps.

Referring to FIGS. 1D and 1E, a die can also be contained within a chip scale package 17A (FIG. 1D) or a chip scale package 17B (FIG. 1E). In FIG. 1D, the chip scale package 17A comprises a semiconductor die 10A, and a BGA substrate 19 bonded to the face of the die 10A using an adhesive layer 21. The BGA substrate 19 includes bumps 12A in electrical communication with bumps 12C on the die 10A. The bumps 12A on the BGA substrate 19 are substantially equivalent to the bumps 12 (FIG. 1B) previously described.

In FIG. 1E, the chip scale package 17B includes a semiconductor die 10B, and protective members 23A, 23B bonded to either side of the die 10B. In addition, the chip scale package 17B includes bumps 12B in electrical communication with the die bond pads via leads 25. An encapsulant 27 and an elastomeric pad 29 electrically isolate the leads 25 and bumps 12B. As is apparent these configurations are merely exemplary and other chip scale package configurations are common in the art.

Referring to FIG. 2, an interconnect 20 constructed in accordance with the invention is shown. The interconnect 20 includes patterns of contact members 22 formed on a substrate 24. Each contact member 22 is adapted to make an electrical connection with a contact bump 12 (FIG. 1B) on the die 10, or a contact bump 12A or 12B on a chip scale package 17A (FIG. ID) or 10B (FIG. 1E). Each contact member 22 comprises one or more projections 26 sized and spaced to retain and electrically contact a single contact bump 12, 12A, 12B.

In the embodiments illustrated in FIGS. 2 and 3, the projections 26 are formed integrally with the substrate 24. In addition, the projections 26 are covered with a conductive layer 28 in electrical communication with a conductor 30. The conductors 30 include contact pads 31 (FIG. 2) arranged along a periphery or other portion of the substrate 24. As will be further explained, the contact pads 31 allow electrical connections to be formed from testing circuitry to the conductors 30.

In the embodiment illustrated in FIGS. 2 and 3, each contact member 22 includes four projections 26 arranged in a generally square shaped array. An alternate embodiment contact member 22A shown in FIG. 3A includes three projections 26 arranged in a generally triangular shaped array. An alternate embodiment contact member 22B, shown in FIG. 3B, includes five projections 26 arranged in a generally pentagonal shaped array. In each of these embodiments, the projections 26 are formed in a spaced polygonal shaped array configured to retain and electrically contact a single contact bump 12, 12A, 12B. However, as is apparent other configurations wherein one or more projections are arranged in arrays for retaining and electrically contacting contact bumps are also possible (e.g., pentagonal, octagonal etc.).

Referring to FIG. 4A, an individual projection 26 for the contact member 22 is illustrated in greater detail. Each projection 26 can be formed integrally with the substrate 24 by etching the substrate 24. With the substrate 24 formed of silicon, an anisotropic etch process can be performed using a mask (not shown) and an etchant such as a solution of KOH and $H_2O$. Using an anisotropic etch process the projections 26 comprise four sided truncated pyramids having sharp edges 32 and angled faces 35. The faces 35 have an angle of about 55° with respect to the surface of the substrate 24.

The conductive layers 28 for the contact members 22 comprise a conductive material formed using a suitable deposition process, such as plating or CVD. The conductive layers 28 can also be formed using a metallization process such a blanket deposition followed by photopatterning and etching.

As shown in FIG. 3, the conductive layers 28 cover the tips 36 and faces 35 of the projections 26. Alternately, just the faces 35 or other surfaces that electrically contact the bumps 12, 12A, 12B can be covered by the conductive layers 28. As also shown in FIG. 3, the conductive layers 28 can cover areas of the substrate 24 adjacent to the projections 26 in a desired pattern (e.g., square, rectangular, triangular). In addition, the conductive layers 28 can be formed in electrical communication with associated conductors 30 (FIG. 2) formed on the surface of the substrate 24. If desired, the same deposition process can be used to form both the conductive layers 28 and the conductors 30. Alternately, the conductive layers 28 and conductors 30 can be formed using separate deposition processes out of different metals. An exemplary thickness for the conductive layers 28 can be from 500 Å to 3 µm or more.

Preferably, the conductive layers 28 comprise a conductive material that can be easily deposited in required patterns on the projections 26 and substrate 24, but which does not form a chemical or physical bond with the contact bumps 12, 12A, 12B during subsequent test procedures using the interconnect 20. For contact bumps 12, 12A, 12B formed of solder, suitable materials for the conductive layers 28 include Be, Mg, Ca, Sr, Ba, Sc, Y, La, Ti, Zr, Hf, V, Nb, Ta, Mo, W, Tc, Re, B, C, Si, Ge and alloys of these materials.

Some of these materials, such as the metals, can be easily plated or metallized in suitable patterns. An exemplary metallization process for metallizing a non-planar topography such as the projections 26, is disclosed in U.S. Pat. No. 5,607,818, incorporated herein by reference.

Other of the above materials can be deposited as alloys or in combination with other elements. For example, the conductive layers 28 can comprise a metal silicide such as $TiSi_2$, $WSi_2$, $TaSi_2$, $MoSi_2$, $PtSi_2$. In this case, a silicon containing layer and a metal layer can be deposited on the projections 26 and reacted to form a metal silicide. An exemplary metal silicide deposition process is disclosed in U.S. Pat. No. 5,483,741, incorporated herein by reference. Still further, other alloys such as TiN, TiW, TiC and NiB can be deposited using CVD or other deposition process.

The conductive layers 28 can also be formed as multi-layered stack of metals comprising a bonding layer selected to bond to the substrate 24, and an outer layer selected to be non-reactive with the contact bumps 12, 12A, 12B.

Referring again to FIG. 4A, an insulating layer 34 can also be formed on the substrate 24 and projections 26. The insulating layer 34 electrically insulates the conductive layer 28 from the bulk of the substrate 24. For a substrate 24 formed of silicon the insulating layer can be a grown or deposited layer of $SiO_2$. An exemplary thickness for a grown or deposited insulating layer 34 can be from about 500 Å to 5000 Å. The insulating layer 34 can also be an elastomer such as polyimide deposited by spin on or other suitable process. If the substrate 24 is formed of an insulating material such as ceramic, the insulating layer 34 is not required.

Referring to FIG. 4B, alternate embodiment projections 26A can be formed integrally with a substrate 24A using an isotropic etch process. In this case, the projections 26A include a rounded or radiused topography substantially as shown. With the substrate 24A formed of silicon, an isotropic etch process can be performed by forming a mask (not shown) on the substrate 24A and etching with a solution of HF, $HNO_3$, and $H_2O$. The projections 26A can also include conductive layers 28A, and an insulating layer 34A formed substantially as previously described.

Referring to FIG. 4C, alternate embodiment projections 26B can be formed on a substrate 24B using a deposition process. In this embodiment, the projections 26B can comprise a metal or conductive polymer screen printed, chemically vapor deposited (CVD), evaporated, electroplated or otherwise deposited on the substrate 24B in a required shape. The projections 26B can be shaped and arranged in arrays to form contact members for the contact bumps 12, 12A, 12B substantially as previously described for contact members 22 (FIG. 3). In this embodiment, the substrate 24B can comprise silicon, ceramic, FR-4 or other materials having a low CTE. With the substrate 24B formed of ceramic, or FR-4, the insulating layer 34 (FIG. 4A) can be optional.

One method for depositing the projections 26B (FIG. 4C) is with a deposition process commercially available from MPM of Franklin, Mass. In general, this process is a stenciling process in which a material is first stenciled and then solvent evaporated or cured. Another suitable process is a "stud bump process" as disclosed in U.S. Pat. No. 5,249,450, incorporated herein by reference. Yet another process is ball bonding, in which wirebonding techniques are used to deposit a desired amount of material.

Referring to FIGS. 5A and 5B, the projections 26 for the contact member 22 can be formed with a spacing "S" (FIG. 5A) and a height "$H_p$" (FIG. 5B). The spacing "S" and height "$H_p$" can be selected such that bumps having a range of bump diameters "$D_{MAX}$" to "$D_{MIN}$" can be retained and electrically contacted by the projections 26. In general, the spacing "S" and height "$H_p$" of the projections corresponds to a range dictated by the size of the bumps being contacted. By way of example and not limitation, the spacing "S" can be between about 5 mils to 30 mils and the height "$H_p$" can be between about 3 mils to 8 mils. More specifically, with a micro BGA having contact bumps with a diameter "D" between about 4.5 and 5.5 mils, and a height "H" between about 2.8 and 4.2 mils, the spacing "S" can be from 3 mils to 10 mils and the height "$H_p$" can be between about 1.5 mils to 3.5 mils.

Still referring to FIGS. 5A and 5B, during a test procedure using the interconnect 20, the die 10 (FIG. 1B) or package 17A, 17B (FIGS. 1D and 1E) can be biased against the interconnect 20. Under this biasing pressure each contact bump 12, 12A, 12B can press into the projections 26 on a mating contact member 22 to form a deformed bump 12D (FIG. 5B). At the same time, the edges 32 of the projections 26 can break the surfaces of the contact bumps 12, 12A, 12B and penetrate any native oxide layers thereon. This allows the conductive layer 28 covering the projections 26 to make electrical contact with the underlying metal of the deformed bumps 12D.

Figure 5C:
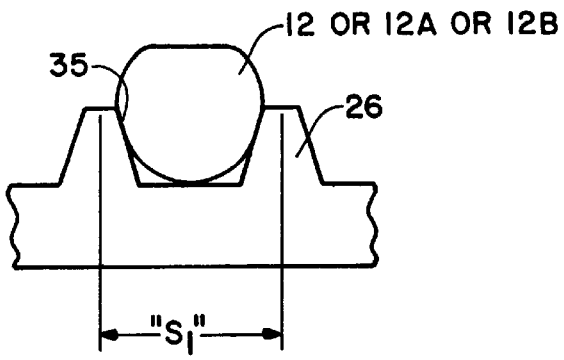
FIG. 5C is a cross sectional view equivalent to FIG. 5B illustrating an alternate spacing for the projections.

Alternately, as shown in FIG. 5C the projections 26 can be formed with a spacing "S1" that allows the contact bumps 12, 12A, 12B to drop into the area between the projections 26. In this embodiment one or more faces 35 of the projections 26 electrically contact the contact bumps 12, 12A, 12B. With the faces 35 having a sloped surface, a scrubbing action is initiated to scrub through the native oxide layers present on the contact bumps 12, 12A, 12B.

Figure 6A:
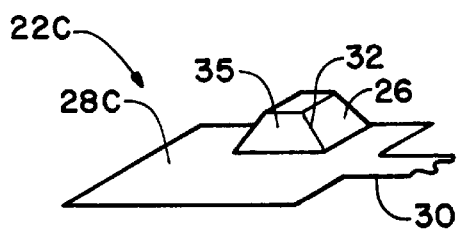
FIG. 6A is an enlarged schematic perspective view of an alternate embodiment contact member having one projection.
Figure 6B:
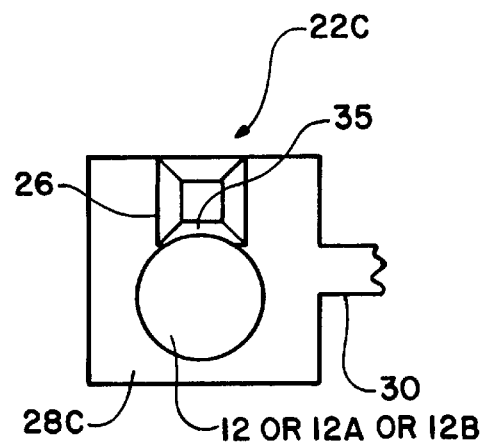
FIG. 6B is an enlarged plan of the projection shown in FIG. 6A.

Referring to FIGS. 6A–6E an alternate embodiment contact member 22C can include a single projection 26 covered with a conductive layer 28C. As shown in FIG. 6B the projections 26 can be formed such that the contact bumps 12, 12A, 12B electrically contact the faces 35 of the projections 26. In addition, the contact bumps 12 electrically contact the conductive layer 28c on the surface of the substrate.

Figure 6C:
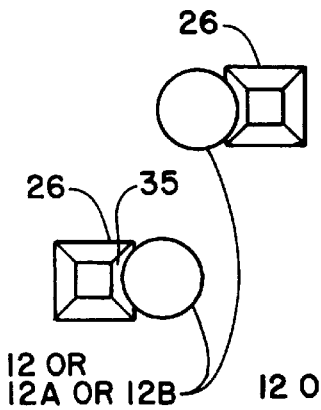
FIG. 6C–6E are enlarged plan views of exemplary self centering patterns for the contact member shown in FIG. 6A.
Figure 6D:
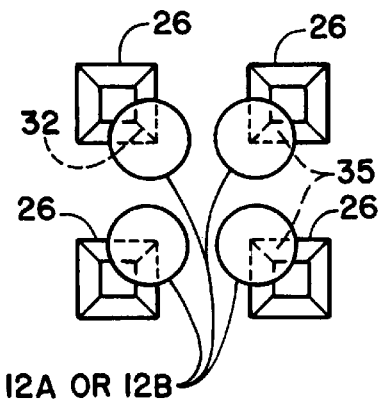
Figure 6E:
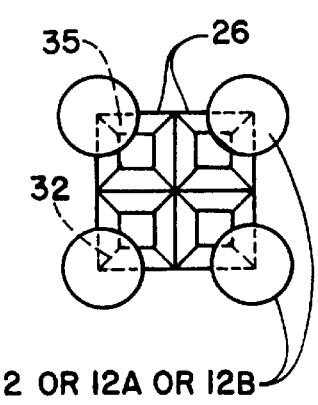

As shown in FIG. 6C the projections 26 can be formed in a pattern that allows the contact bumps 12, 12A, 12B to self center on the projections 26. Thus even though a pitch or location of the contact bumps 12, 12A, 12B, may vary the projections 26 will still make contact. FIGS. 6D and 6E also illustrate self centering patterns for the projections 26. In FIG. 6D and 6E the projections 26 can be spaced in patterns that permit the edges 32 of the projections to penetrate a surface of the contact bumps 12, 12A, 12B.

Figure 7:
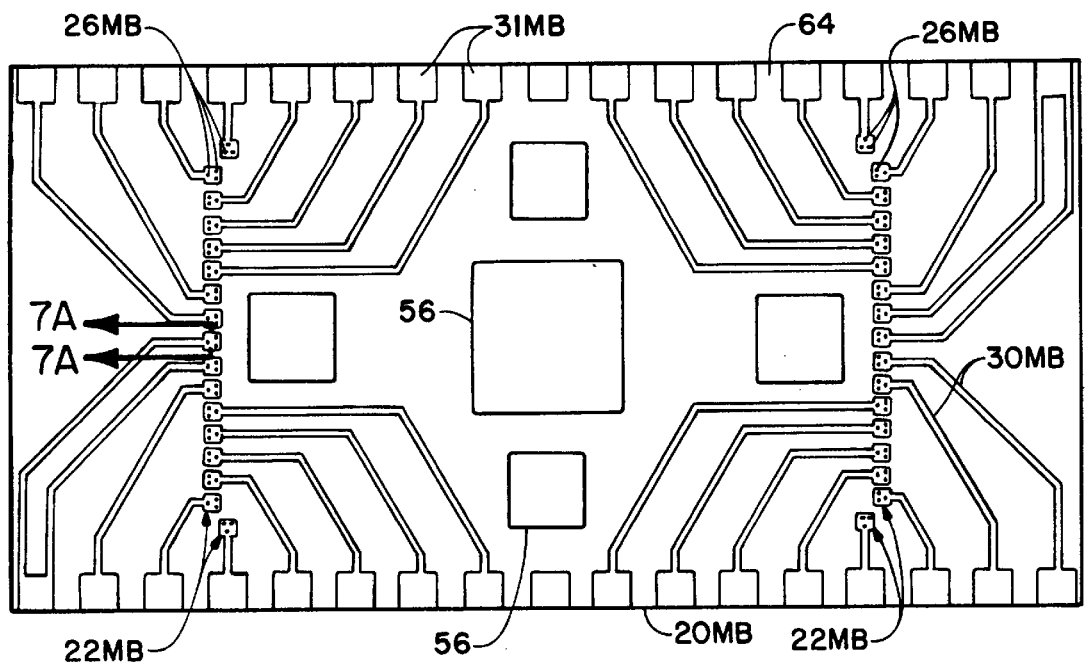
FIG. 7 is an enlarged plan view of an alternate embodiment interconnect fabricated with microbump contact members.
Figure 7A:
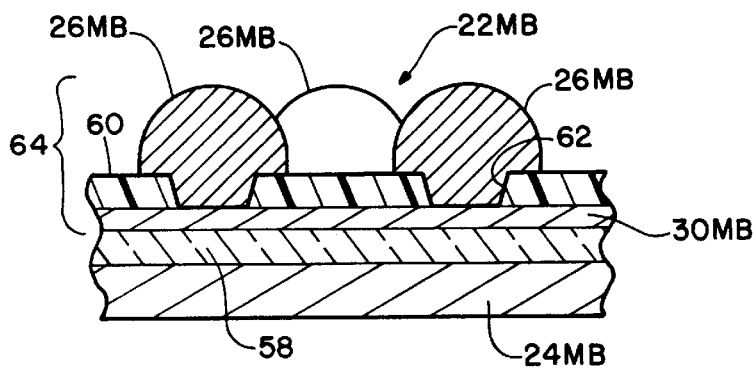
FIG. 7A is a cross sectional view of a microbump contact member taken along section line 7A—7A of FIG. 7.

Referring to FIGS. 7 and 7A, an alternate embodiment interconnect 20MB includes patterns of microbump contact members 22MB. The microbump contact members 22MB function substantially as previously described for contact members 22. As shown in FIG. 7A, each microbump contact member 22MB includes an array of one or more microbump projections 26MB. In the illustrative embodiment, there are three microbump projections 26MB per contact member 22MB arranged in a triangular array. However, as previously explained, other array configurations are possible (e.g., square, pentagonal). The microbump projections 26MB are spaced to retain and establish electrical communication with contact bumps 12, 12A, 12B substantially as previously explained.

As shown in FIG. 7A, the microbump contact members 22MB can be formed on a multi-layered tape 64 similar to TAB tape, or ASMAT manufactured by Nitto Denko. The multilayered tape 64 includes a polymer film 60 and a laminated pattern of conductors 30MB. The conductors 30MB can be formed of a highly conductive metal such as copper foil. The conductors 30MB can include contact pads 31MB (FIG. 7) for forming electrical paths from testing circuitry by wire bonding or using mechanical electrical connectors. In addition, printed alignment fiducials 56 (FIG. 7) can be formed on the tape 64 for aligning the interconnect 20MB during use.

The microbump projections 26MB can be formed in vias 62 in the polymer film 60 in electrical communication with the conductors 30MB. A representative outside diameter for the microbump projections 26MB can be from 15–100 µm depending on the size of the contact bumps 12, 12A, 12B. A spacing for the microbump projections 26MB will depend on the size of the contact bumps 12, 12A, 12B but can be from 3 to 30 mils. The microbump projections 26MB can be formed of copper, nickel, gold, palladium or the metals and alloys previously listed for projections 26. Optionally, a cap layer comprising an inert metal, such as palladium, gold or platinum, can be formed on the surface of the microbumps projections 26MB. A suitable deposition process such as electroplating or evaporation can be used to form the microbump projections 26MB.

As also shown in FIG. 7A, the multi layered tape 64 can be mounted on a rigid substrate 24MB formed of silicon, ceramic, or FR-4. An adhesive layer 58 can be used to attach the tape 64 to the substrate 24MB and to provide a cushioning effect. On suitable adhesive for forming the adhesive layer 58 is silicone.

Figure 7B:
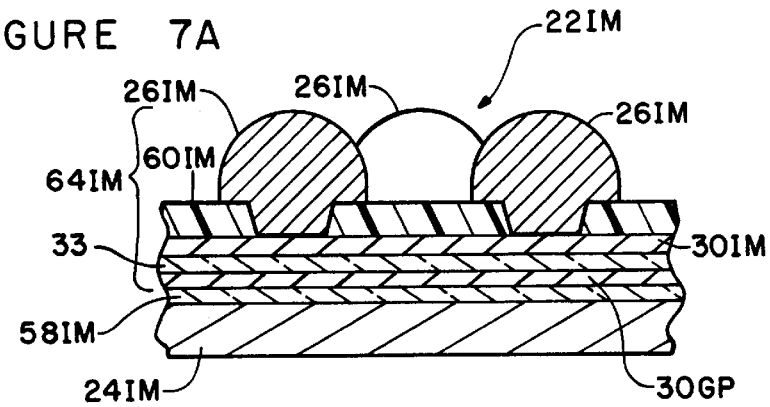
FIG. 7B is a cross sectional view equivalent to FIG. 7A of an alternate embodiment impedance matched contact member.

Referring to FIG. 7B, an alternate embodiment impedance matched contact member 22IM can be formed substantially as previously described for microbump contact member 22MB (FIG. 7A). The impedance matched contact member 22IM comprises a tape 64IM including microbump projections 26IM and a polyimide film 60IM. The tape 64IM can be attached to a substrate 24IM using an adhesive layer 58IM as previously described. However in this embodiment, the multi layer tape 64IM includes a voltage or ground plane 30GP. The voltage or ground plane 30GP comprises a metal layer separated from conductors 30IM on the tape 64IM by a dielectric layer 33. The voltage or ground plane 30GP is located at a predetermined spacing with respect to the conductors 30IM. This permits an impedance of the conductors 30IM to be matched to an impedance of other electrical components of a testing system (e.g., testing circuitry).

Die Level Test System

Referring to FIGS. 8–8B, a die level system 40D for testing singulated semiconductor dice 10 or packages 17A, 17B in accordance with the invention is shown. The die level test system 40D includes an interconnect 20D, a force applying mechanism 42, and a testing apparatus 44 in electrical communication with testing circuitry 46.

The interconnect 20D is configured to mount one or more dice 10, or chip scale package 17A or 17B, in electrical communication with the testing apparatus 44 and testing circuitry 46. The interconnect 20D is formed substantially as previously described for interconnect 20 (FIG. 2). The interconnect 20D includes patterns of contact members 22D configured to retain and make electrical connections with the contact bumps 12, 12A or 12B, on the dice 10 or packages 17A or 17B.

In the die level system 40D, the testing apparatus 44 can be a test socket on a burn-in board, or similar apparatus used for testing conventional plastic or ceramic semiconductor packages. In addition, the testing apparatus 44 can include electrical connectors 48 (FIG. 8A) configured to electrically contact the contact pads 31D on the conductors 30D. The electrical connectors 48 can comprise clips, slides, wire bonds or similar electrical members. The electrical connectors 48 form separate electrical paths between the testing circuitry 46 and the contact members 22D.

As shown in FIG. 8A, the force applying mechanism 42 can be shaped as a bridge clamp, and can include clip members 50 that attach to the interconnect 20D. Openings or slots (not shown) can be provided on the interconnect 20D for mating engagement with the clip members 50. In addition, the force applying mechanism 42 includes spring members 52 configured to bias the dice 10, or chip scale packages 17A, 17B, against the interconnect 20D. The spring members 52 can comprise curved metal springs or alternately resilient members 52A (FIG. 8B).

For assembling the dice 10, or packages 17A or 17B, on the interconnect 20D, optical alignment techniques can be used to optically align the bumps 12, 12A, 12B with the contact members 22D. A suitable method of optical alignment is disclosed in U.S. Pat. No. 5,519,332, incorporated herein by reference. The contact members 22D can be dimensioned to accommodate some misalignment of the bumps 12, 12A, 12B with respect to the contact members 22D. In addition, the contact members 22D can provide an alignment function by allowing the bumps 12, 12A, 12B to self center within the contact members 22D. The contact members 22D can also accommodate z-direction variations in the bumps 12, 12A, 12B (i.e., planarity of the bumps). Still further, the bumps 12, 12A, 12B can be planarized by contact with the contact members 22D.

In FIG. 8B, an alternate embodiment interconnect 20E includes terminal contacts 54. The terminal contacts 54 are in electrical communication with the contact members 22D (FIG. 8A) and conductors 30D (FIG. 8A). The terminal contacts 54 can comprise ball, pins, or pads arranged in a dense grid array (e.g., BGA). The terminal contacts 54 establish electrical communication with the testing apparatus 44 (FIG. 8) substantially as previously described for electrical connectors 48.

Also with the alternate embodiment interconnect 20E, the force distribution mechanism 42A includes resilient spring members 52A. The resilient spring members 52A can comprise an elastomeric material such as silicone. Alternately the spring members 52A can comprise a fluid or gas filled bladder.

Wafer Level Test System

Referring to FIGS. 9 and 9A, a wafer level test system 40W is illustrated. The wafer level test system 40W is configured to test bumped semiconductor dice (e.g., 10–FIG. 1A) contained on a semiconductor wafer 66 or other semiconductor substrate. The wafer level test system 40W includes an interconnect 20W constructed in accordance with the invention substantially as previously described, and mounted to a probe card fixture 72 of a testing apparatus 68.

The testing apparatus 68 includes or is in electrical communication with testing circuitry 70. The testing apparatus 68 can be a conventional wafer probe handler, or probe tester, modified for use with the interconnect 20W. Wafer probe handlers and associated test equipment are commercially available from Electroglass, Advantest, Teradyne, Megatest, Hewlett-Packard and others. In this system 40W, the interconnect 20W takes the place of a conventional probe card. In addition, the interconnect 20W can include test circuitry to replace a portion or all of the test circuitry 46.

As shown in FIG. 9A, the interconnect 20W includes contact members 22W configured to establish electrical communication with contact bumps 12W on the wafer 66. The contact members 22W on the interconnect 20W are formed in patterns that match the patterns of the bumps 12W on the wafer 66.

With interconnect 20W, the testing apparatus 68 can be used to step the wafer 66, or to step the interconnect 20W, so that the dice can be tested in groups until all of the dice on the wafer 66 have been tested. Alternately, with interconnect 20W, the contact members 22W can be configured to contact every bump 12W for all of the dice on the wafer 66 at the same time. Test signals can then be selectively applied and electronically switched as required, to selected dice on the wafer 66.

As shown in FIGS. 9A, the interconnect 20W can mount to the probe card fixture 72 of the testing apparatus 68. The probe card fixture 72 can be similar in construction to a conventional probe card fixture commercially available from manufacturers such as Packard Hughes Interconnect and Wentworth Laboratories. The probe card fixture 72 can be formed of an electrically insulating material such as FR-4 or ceramic. In addition, the testing apparatus 68 can include a force applying mechanism 74 associated with the probe card fixture 72.

The interconnect 20W can be mounted to a mounting plate 76 in contact with force application members 78 of the force applying mechanism 74. The force application members 78 can be spring loaded pins or equivalent elements. In addition, a biasing member 80 formed of an elastomeric material, or as a fluid or gas filled bladder, can be mounted between the mounting plate 76 and interconnect 20W.

Still further, conductive paths 82 can be formed from the probe card fixture 72 to the mounting plate 76. By way of example, the conductive paths 82 can comprise multi layered tape with laminated conductors similar to TAB tape, or ASMAT manufactured by Nitto, Denko. In addition, bond wires 84 can be used to electrically connect the conductors on the mounting plate 76 to the conductors for the contact members 22W.

Further details of a wafer level system similar to the system 40W are contained in U.S. patent application Ser. No. 08/797,719, filed Feb. 11, 1997, entitled "PROBE CARD FOR SEMICONDUCTOR WAFERS AND METHOD AND SYSTEM FOR TESTING WAFERS" which is incorporated herein by reference.

Testing Method

Referring again to FIGS. 8A and 8B, a representative test sequence for the die level system 40D is as follows. Initially the interconnect 20D, force applying mechanism 42 and testing apparatus 44 can be provided. For assembling the dice 10 or packages 17A, 17B, the bumps 12, 12A, 12B can be aligned with the contact members 22D on the interconnect 20D. This can be accomplished using an optical alignment apparatus as described in the previously cited U.S. Pat. No. 5,519,332. The aligned dice 10, or packages 17A, 17B, and interconnect 20D can then be placed in contact and the force applying mechanism 42 attached to the interconnect 20D.

The assembly can then be placed within the testing apparatus 44. Mounted within the testing apparatus 44, test signals can be applied by the testing circuitry 46 to the integrated circuits and semiconductor devices on the dice 10 or packages 17A, 17B.

Referring again to FIGS. 9 and 9A, a representative test sequence for the wafer level system 40W is as follows. Initially the testing apparatus 68 can be provided. The interconnect 20W can be mounted to the testing apparatus 68. The testing apparatus 68 can then be operated to bias the interconnect 20W and wafer 66 together. The biasing member 80 functions as previously described to cushion the forces applied by the testing apparatus 64 to the interconnect 20W and to allow the contact members 22W to self planarize to the bumps 12W on the wafer 66. Test signals can then be applied by the testing circuitry 70 to the integrated circuits and semiconductor devices on the wafer 66.

With interconnect 20W configured to contact all of the dice on the wafer 66 at the same time, the test signals can be electronically switched, as required, to selected dice. With interconnect 20W configured to contact a portion of the dice on the wafer 66, stepping techniques can be used to step the interconnect 20W, or the wafer 66, such that the dice are tested in sequence. In addition, the mounting of the interconnect 20W to the probe card fixture 72, permits different interconnects to be easily interchanged for testing different types of wafers.

Thus the invention provides an improved interconnect for testing semiconductor dice or packages having contact bumps. The interconnect is designed to provide a reliable electrical connection to the contact bumps within a specified size range, and with a minimal application of contact force. In addition, the contact members do not excessively deform the contact bumps or produce large pockets or voids in the contact bumps. Still further, the contact members aid is centering the contact bumps to the interconnect and help to planarize a height of the contact bumps.

While the invention has been described with reference to certain preferred embodiments, as will be apparent to those skilled in the art, certain changes and modifications can be made without departing from the scope of the invention as defined by the following claims.

What is claimed is:

1. An interconnect for a semiconductor component comprising:
   a substrate; and
   a contact member configured to electrically engage a contact bump on the component, the contact member comprising a plurality of electrically conductive projections on the substrate configured to retain the contact bump therebetween, each projection comprising a raised portion of the substrate at least partially covered with a non-bonding conductive layer, each projection comprising at least one edge configured to penetrate the contact bump and at least one face configured to electrically engage the contact bump.

2. The interconnect of claim 1 wherein the substrate comprises silicon.

3. The interconnect of claim 1 wherein the contact member comprises from three to five projections.

4. The interconnect of claim 1 wherein the conductive layer comprises an element selected from the group consisting of Be, Mg, Ca, Sr, Ba, Sc, Y, La, Ti, Zr, Hf, V, Nb, Ta, Mo, W, Tc, Re, B, C, Si and Ge.

5. An interconnect for a semiconductor component comprising:
   a substrate;
   a plurality of projections on the substrate sized and spaced to form a contact member configured to retain and electrically engage a contact bump on the component, the projections comprising portions of the substrate at least partially covered with an electrically conductive layer comprising a material that does not bond to the contact bump, each projection having a generally truncated pyramidal configuration comprising at least one edge configured to penetrate the contact bump and at least one face configured to electrically engage the contact bump; and
   a conductor on the substrate in electrical communication with the conductive layer.

6. The interconnect of claim 5 wherein the substrate comprises silicon.

7. The interconnect of claim 5 wherein the material comprises an element selected from the group consisting of Be, Mg, Ca, Sr, Ba, Sc, Y, La, Ti, Zr, Hf, V, Nb, Ta, Mo, W, Tc, Re, B, C, Si and Ge.

8. The interconnect of claim 5 wherein the contact member comprises from three to five projections.

9. The interconnect of claim 5 wherein the contact member comprises from three to five angled faces configured to electrically engage the contact bump.

10. An interconnect for electrically contacting a semiconductor component comprising:
    a substrate; and
    a contact member configured to electrically engage a contact bump on the component, the contact member comprising a plurality of projections comprising raised portions of the substrate at least partially covered with a conductive layer comprising a material that is non-bonding with the contact bump, the projections sized and spaced to retain the contact bump therebetween, the projections and the conductive layer comprising a plurality of edges configured to penetrate into the contact bump and a plurality of faces configured to electrically engage the contact bump.

11. The interconnect of claim 10 wherein the substrate comprises silicon.

12. The interconnect of claim 10 wherein the conductive layer comprises an element selected from the group consisting of Be, Mg, Ca, Sr, Ba, Sc, Y, La, Ti, Zr, Hf, V, Nb, Ta, Mo, W, Tc, Re, B, C, Si, and Ge.

13. The interconnect of claim 10 wherein the contact member comprises from three to five projections in a spaced array.

14. An interconnect for electrically contacting a semiconductor component having contact bumps comprising:

a substrate;

a plurality of contact members on the substrate, each contact member comprising a plurality of electrically conductive projections formed in a spaced array and configured to retain and electrically engage a contact bump on the component, each projection having a truncated pyramidal configuration comprising at least one angled face configured to electrically contact the contact bump and at least one edge configured to penetrate the contact bump, such that the contact bump is penetrated by a plurality of edges and electrically contacted by a plurality of angled faces; and at least one conductor on the substrate in electrical communication with the conductive projections.

15. The interconnect of claim 14 wherein the substrate comprises silicon and the projections comprise portions of the substrate.

16. A method for testing a semiconductor component comprising:

providing testing circuitry;

providing an interconnect for establishing electrical communication between the component and the testing circuitry, the interconnect comprising a substrate and a contact member comprising a plurality of projections comprising raised portions of the substrate at least partially covered with a non-bonding conductive layer and configured to retain and electrically contact a contact bump of the component therebetween, each projection comprising at least one edge configured to penetrate the contact bump and at least one face configured to electrically engage the contact bump;

placing the component on the interconnect with the contact bump in electrical communication with the projections, and the conductive layer in electrical communication with the testing circuitry; and applying test signals through the contact member and the contact bump to the component.

17. The method of claim 16 wherein the conductive layer comprises an element selected from the group consisting of Be, Mg, Ca, Sr, Ba, Sc, Y, La, Ti, Zr, Hf, V, Nb, Ta, Mo, W, Tc, Re, B, C, Si and Ge.

18. The method of claim 16 wherein each contact member comprises from three to five projections.

19. A method for testing a semiconductor component comprising:

providing testing circuitry;

providing an interconnect for establishing electrical communication between the component and the testing circuitry, the interconnect comprising a substrate and a plurality of projections comprising portions of the substrate at least partially covered with a non-bonding conductive layer and configured to retain a contact bump on the component therebetween, each projection having a generally truncated pyramidal configuration such that the projections form a contact member having a plurality of angled faces configured to electrically contact the contact bump and a plurality of edges configured to penetrate the contact bump;

placing the component on the interconnect with the contact bump in electrical communication with the conductive layer and with the testing circuitry; and applying test signals through the conductive layer and the contact bump to the component.

20. The method of claim 19 wherein the substrate comprises silicon.

21. An interconnect for a semiconductor component comprising:

a substrate comprising silicon; and a contact member on the substrate configured to electrically engage a contact bump on the component, the contact member comprising a plurality of projections comprising portions of the substrate configured to retain a contact bump on the component therebetween, and a conductive layer at least partially covering the projections comprising an element selected from the group consisting of Be, Mg, Ca, Sr, Ba, Sc, Y, La, Ti, Zr, Hf, V, Nb, Ta, Mo, W, Tc, Re, B, C, Si and Ge, the projections comprising a plurality of edges for penetrating the contact bump and a plurality of angled faces for electrically contacting the contact bump.

22. The interconnect of claim 21 wherein the contact member comprises from three to five projections.

23. The interconnect of claim 21 wherein the contact member is configured to electrically engage different sizes of contact bumps on the component.

24. The interconnect of claim 21 wherein the projections comprise etched portions of the substrate.

25. The interconnect of claim 21 wherein the projections comprise generally pyramidally shaped truncated pillars.

* * * * *